United States Patent
Barsun et al.

(10) Patent No.: US 6,707,675 B1
(45) Date of Patent: Mar. 16, 2004

(54) EMI CONTAINMENT DEVICE AND METHOD

(75) Inventors: Stephan K. Barsun, Auburn, CA (US); Steven R. Hahn, El Dorado Hills, CA (US); Jeremy I. Wilson, Rocklin, CA (US); Thomas J. Augustin, El Dorado Hills, CA (US); Todd D. Robertus, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/323,245

(22) Filed: Dec. 18, 2002

(51) Int. Cl.[7] .............................. H05K 7/20; H05K 9/00
(52) U.S. Cl. ....................... 361/704; 361/719; 361/818; 174/16.3; 174/35 R
(58) Field of Search ................................ 361/704, 707, 361/715, 717–721, 816, 818; 174/51; 165/80.3, 185; 257/706, 718

(56) References Cited

U.S. PATENT DOCUMENTS

| | | | |
|---|---|---|---|
| 5,014,160 A | 5/1991 | McCoy, Jr. | |
| 5,030,793 A | 7/1991 | McCarthy | |
| 5,202,815 A | 4/1993 | Le Boennec et al. | |
| 5,638,259 A | 6/1997 | McCarthy et al. | |
| 5,740,013 A | 4/1998 | Roesner et al. | |
| 5,774,344 A | 6/1998 | Casebolt | |
| 5,880,930 A | * 3/1999 | Wheaton | 361/690 |
| 5,928,076 A | 7/1999 | Clements et al. | |
| 6,061,235 A | * 5/2000 | Cromwell et al. | 361/690 |
| 6,084,178 A | * 7/2000 | Cromwell | 174/35 R |
| 6,121,545 A | 9/2000 | Peng et al. | |
| 6,122,167 A | 9/2000 | Smith et al. | |
| 6,137,051 A | 10/2000 | Bundza | |
| 6,166,908 A | * 12/2000 | Samaras et al. | 361/700 |
| 6,198,630 B1 | * 3/2001 | Cromwell | 361/704 |
| 5,928,076 C1 | 4/2001 | Clements et al. | |
| 6,324,075 B1 | 11/2001 | Unrein et al. | |
| 6,362,977 B1 | * 3/2002 | Tucker et al. | 361/818 |
| 6,387,523 B2 | 5/2002 | Bunyan et al. | |
| 6,411,522 B1 | 6/2002 | Frank, Jr. et al. | |
| 6,442,045 B1 | * 8/2002 | Goodwin et al. | 361/816 |
| 6,451,374 B1 | 9/2002 | Watchko et al. | |
| 6,501,018 B2 | * 12/2002 | Mayer | 174/35 R |
| 6,545,871 B1 | * 4/2003 | Ramspacher et al. | 361/709 |

* cited by examiner

Primary Examiner—Boris Chervinsky

(57) ABSTRACT

Disclosed herein are electromagnetic interference 'EMI' containment devices and methods for abating interference generated by electronic devices.

14 Claims, 7 Drawing Sheets

EMI CONTAINMENT DEVICE AND METHOD

BACKGROUND

Electromagnetic interference 'EMI' is unintentional interference emitted by electronic equipment. EMI can interfere with external equipment such as radios, televisions and computers. EMI is also capable of interfering with circuitry within the unit containing the EMI-generating electronic component. As used herein, the term electromagnetic interference 'EMI' refers to interfering electromagnetic energy of any wavelength.

EMI has increased as electronic components and their assemblies have become faster and more compact. Modern digital circuits are capable of generating and processing signals with rise times as short as two nanoseconds. These signals substantially increase the speed of operation of circuits; however, they are also natural sources of wide spectrum EMI. One of the most troubling EMI problems is how to contain the 'noise' to prevent these extremely fast digital circuits from interfering with the operation of other digital circuits positioned nearby.

SUMMARY

Methods and apparatus for containing electromagnetic interference disclosed herein may include: providing a circuit board comprising a first surface and a socket, the socket being formed on the first surface; providing an assembly comprising an electronic component that generates the electromagnetic interference; connecting the electronic component to the socket; providing a cage comprising at least one gasket; and positioning the cage adjoining the circuit board with the assembly attached thereto.

BRIEF DESCRIPTION OF THE DRAWINGS

Illustrative embodiments are shown in Figures of the drawing in which.

DETAILED DESCRIPTION

Figure 1:
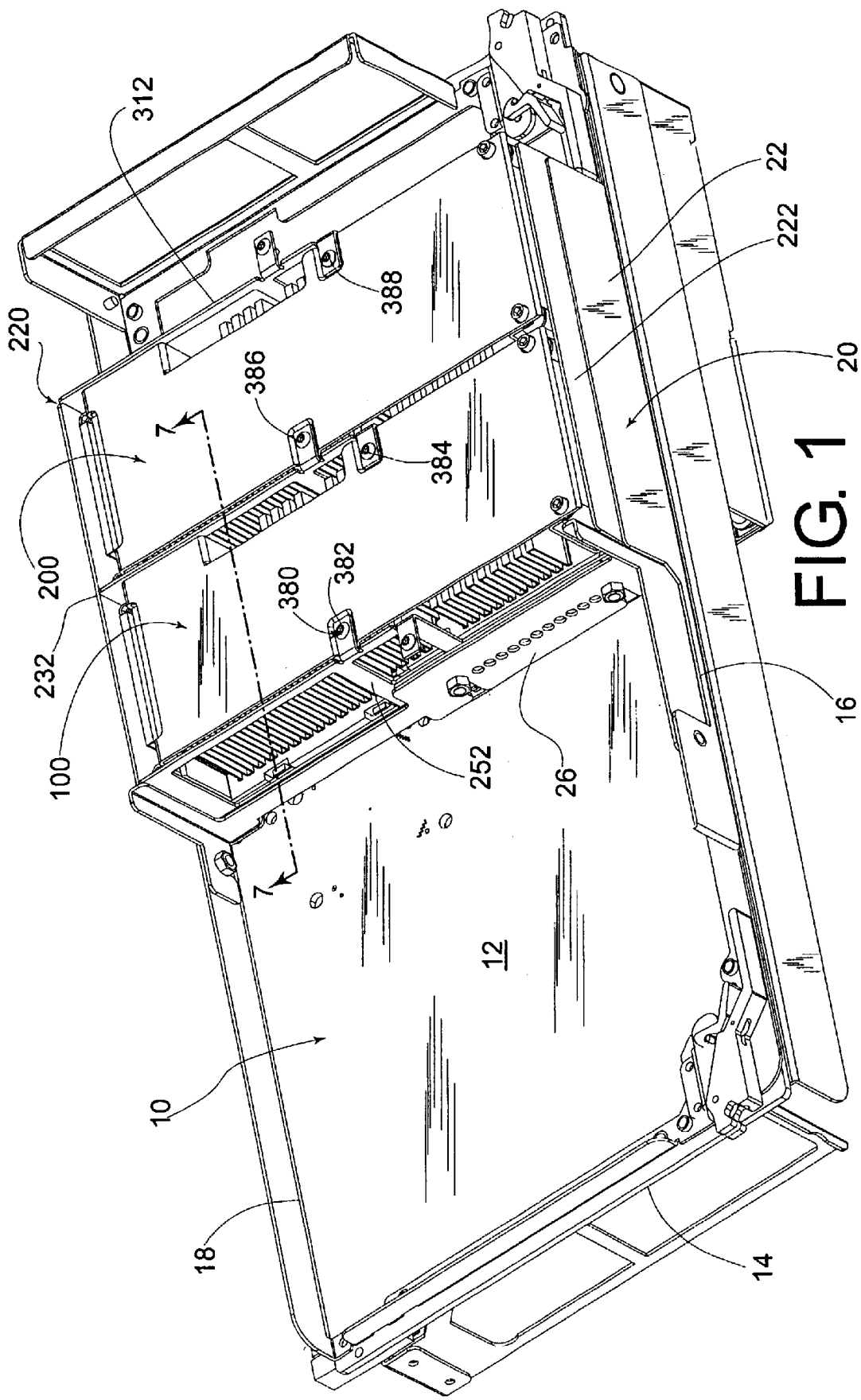
FIG. 1 shows a perspective view of a printed circuit board provided with an assembly and a carrier cage configured to contain EMI generated by an electronic component.

In one exemplary embodiment illustrated in FIG. 1, an EMI containment device is provided for confining electromagnetic interference 'EMI' to a containment area. This EMI containment device may be provided with a circuit board, an assembly, an EMI-generating electronic component, a heat sink and a carrier cage. This containment area may be defined by various planes, walls, surfaces, sides and gaskets, including the heat sink itself. In basic terms, the present device may include the heat sink with the EMI-generating electronic component mounted thereto (sometimes referred to herein as the assembly). This EMI-generating electronic component (that is a part of the assembly) is electrically connected to the circuit board. After connecting the electronic component to the circuit board, the carrier cage may be placed substantially around the assembly to transfer the absorbed EMI to ground. This EMI containment device substantially prohibits the EMI-generating component from interfering with nearby components.

Having provided a brief overview of one exemplary EMI containment device, descriptions of exemplary components of the EMI containment device will now be provided.

Circuit Board

FIG. 1 shows one exemplary type of printed circuit board 10, of the type commonly referred to as a 'motherboard'. Such 'motherboards', in turn, are commonly used in computers. The circuit board 10 may be provided with a first surface 12, an oppositely disposed second surface 14, a first edge 16 and an oppositely disposed second edge 18. The circuit board 10 may include several layers (e.g. 21 layers) containing various conductors and electronics. In one exemplary embodiment, the first and second surfaces 12, 14 may be grounded. As used herein, the term 'grounded' may be used to describe a component that is directly or indirectly connected to earth (which may occur via a power supply). Components that are grounded may receive current and/or signals (e.g. EMI) and transfer this energy to earth.

Figure 2:
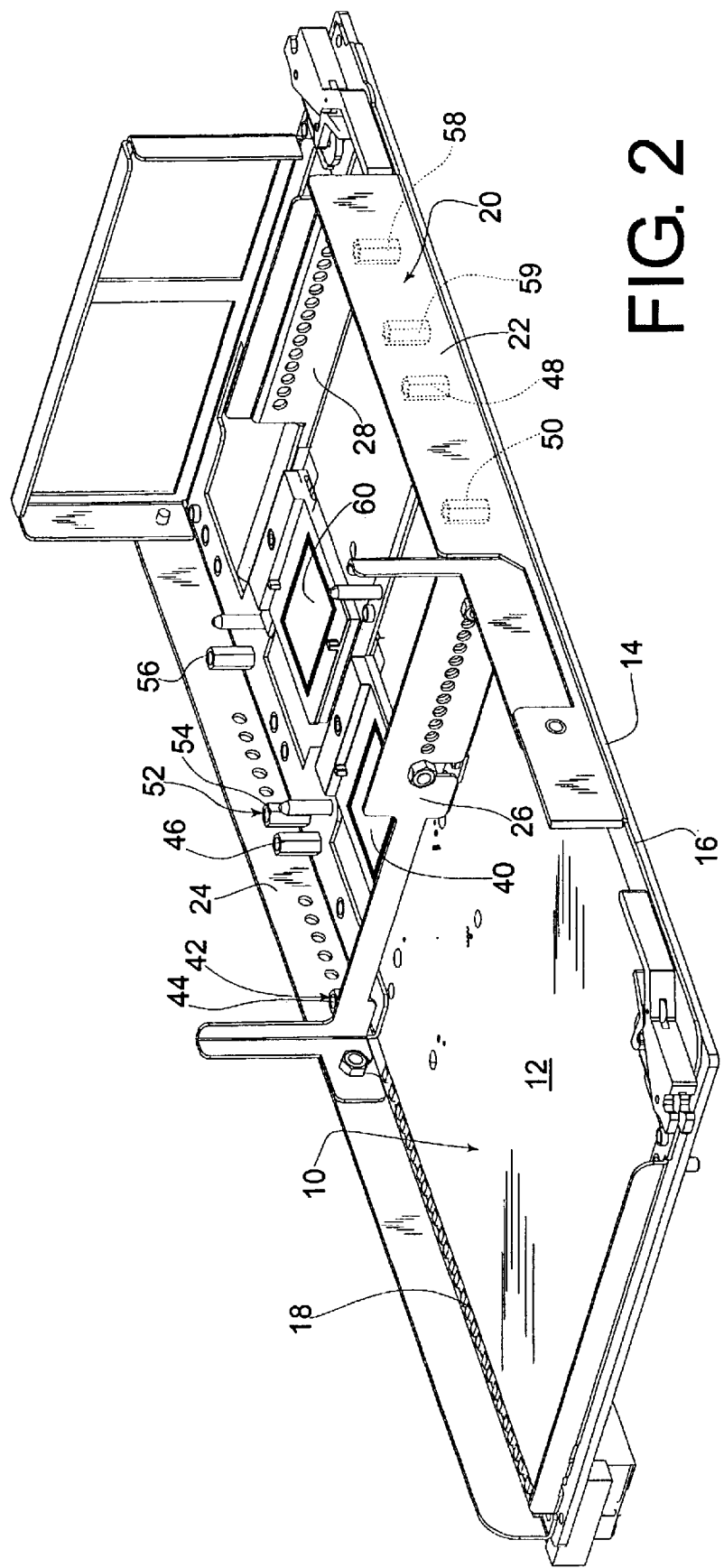
FIG. 2 shows a perspective view of the printed circuit board of FIG. 1 with the assembly, carrier cage and electronic component removed therefrom.

With continued reference to FIG. 1, the circuit board 10 may be further provided with a frame 20 for supporting the somewhat delicate circuit board 10 and for containing EMI. The frame 20 may be provided with a first wall 22, an oppositely disposed second wall 24 (FIG. 2), a third wall 26 and an oppositely disposed fourth wall 28 (FIG. 2). The frame first wall 22 may be adjacent to the circuit board first edge 16 and perpendicular to the circuit board first surface 12. The frame second wall 24 (FIG. 2) may be adjacent to the circuit board second edge 18 and perpendicular to the circuit board first surface 12. The frame third wall 26 may be perpendicular to and contacting the circuit board first surface 12 and perpendicular to the first and second walls 22, 24 (FIG. 2). The frame fourth wall 28 (FIG. 2) may be adjacent to the circuit board first surface 12 and perpendicular to the first and second walls 22, 24; the frame fourth wall 28 may, also, be perpendicular to the circuit board first surface 12. The frame 20 may be composed of any of a variety of materials, such as plastic, ferrous metal, non-ferrous metal, etc. In one exemplary embodiment the frame 20 may be an electrically conducting material such as cold rolled steel that is zinc plated. Additionally, in one exemplary embodiment, the frame 20 may be electrically interfaced with the circuit board first surface 12 (therefore, the frame 20 may be grounded).

FIG. 2 shows the circuit board 10 with various components removed therefrom (these removed components will be described later herein). The circuit board 10 may be provided with a first socket 40 and a second socket 60. The first socket 40 may be formed on the circuit board first surface 12 and electrically coupled to the circuit board 10. The first socket 40 may be located within an EMI containment area partially bound by the first, second, third and fourth walls 22, 24, 26, 28 of the frame 20. The circuit board 10 may be further provided with a plurality of first assembly mounts 42, such as a first mount 44, a second mount 46, a third mount 48 and a fourth mount 50. The second socket 60 may be formed on the circuit board first surface 12 and electrically coupled to the circuit board 10. The second socket 60 may also be located within the EMI containment area partially bound by the first, second, third and fourth walls 22, 24, 26, 28 of the frame 20. Additionally, the second socket 60 may be somewhat adjacent to the first socket 40. The circuit board 10 may be provided with a plurality of second assembly mounts 52, such as a fifth mount 54, a sixth mount 56, a seventh mount 58 and an eighth mount 59.

Pair of Assemblies

Figure 3:
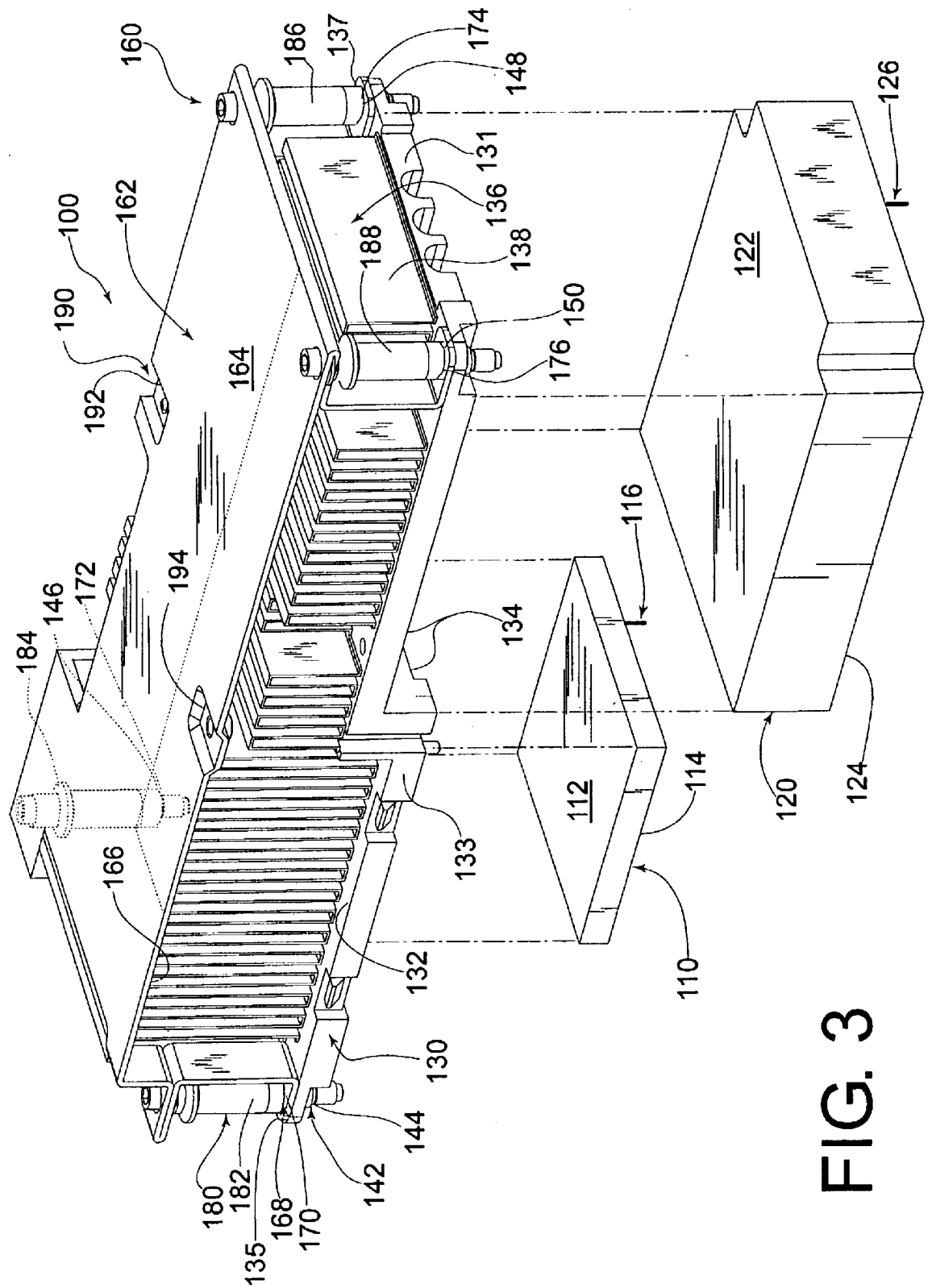
FIG. 3 shows a perspective view of an exemplary assembly in an exploded state, wherein a processor and a power supply are illustrated as being separated from their assembled positions.

With reference to FIG. 1, the present EMI containment device may be provided with a pair of assemblies such as a first assembly 100 and a second assembly 200. These assemblies 100, 200 may be electrically coupled to the circuit board 10 via the first and second sockets 40, 60, respectively. One exemplary first assembly 100 is shown in an exploded state in FIG. 3. With reference to FIG. 3, the first assembly 100 may be provided with a first processor 110, a first power supply 120, a heat sink 130 and a retention device 160. The first processor 110 may be provided with a first surface 112 and an oppositely disposed second surface 114. The first processor 110 may be provided with a plurality of contacts 116 formed on the second surface 114. The first power supply 120 may be provided with a first surface 122 and an oppositely disposed second surface 124. The first power supply 120 may be further provided with a plurality of contacts 126 formed on the second surface 124.

FIG. 3 illustrates that the first assembly heat sink 130 may be provided with a first surface 132 and an oppositely disposed second surface 134. The heat sink 130 may be further provided with a plurality of fins 136 (e.g. first fin 138) located adjacent to the first surface 132. The plurality of fins 136 may protrude from the heat sink first surface 132 and be configured to receive heat generated by the first processor 110 and the first power supply 120. The fins 136 may be integral to the heat sink 130 and attached via a brazing process so that the heat sink 130 and fins 136 are one complete assembly. Additionally, the first assembly heat sink 130 may be provided with a first side 131, a second side 133, a third side 135 and a fourth side 137. The first assembly heat sink first side 131 may be oppositely disposed from the third side 135. The first assembly heat sink second side 133 may be oppositely disposed from the fourth side 137; additionally, the second and fourth sides 133, 137 may be formed perpendicular to the first and third sides 131, 135. The heat sink 130 may be further provided with a plurality of retention plate holes 142, such as a first retention plate hole 144, a second retention plate hole 146, a third retention plate hole 148 and a fourth retention plate hole 150. The retention plate holes 142 may take the form of threaded holes extending from the first assembly heat sink first surface 132 to the second surface 134.

The retention device 160 may be provided with a retention plate 162 and a plurality of clamps 180. The retention plate 162 may be further provided with a first surface 164 and an oppositely disposed second surface 166. The retention plate 162 may be further provided with a plurality of mounting holes 168, such as a first mounting hole 170, a second mounting hole 172, a third mounting hole 174 and a fourth mounting hole 176. The plurality of clamps 180 may include a first clamp 182, a second clamp 184, a third clamp 186 and a forth clamp 188.

With continued reference to FIG. 3, the clamps 180 may take the form of shoulder bolts provided with compression springs. In one exemplary configuration, the heat sink 130 may be attached to the motherboard 10 by the clamps 180. These clamps 180 may be configured such that the first clamp 182 may be positioned in the retention plate first mounting hole 170 and threaded into the heat sink first retention plate hole 144. The second clamp 184 may be positioned in the retention plate second mounting hole 172 and threaded into the heat sink second retention plate hole 146. The third clamp 186 may be positioned in the retention plate third mounting hole 174 and threaded into the heat sink third retention plate hole 148. The fourth clamp 188 may be positioned in the retention plate fourth mounting hole 176 and threaded into the heat sink fourth retention plate hole 150. The first assembly retention device retention plate 162 may also be provided with a plurality of carrier cage mounts 190, such as a first mount 192 and a second mount 194.

With continued reference to FIG. 3, the first processor 110 may be mounted (via a bracket, not shown) in thermal communication with the heat sink 130 such that the first processor first surface 112 adjoins the heat sink second surface 134. This mounting of the first processor 110 may result in the first processor 110 being somewhat 'attached' to the heat sink 130 and, thereby, a component of the first assembly 100. Additionally, the first power supply 120 may be mounted in thermal communication with the heat sink 130 such that the first power supply first surface 122 adjoins the heat sink second surface 134. This mounting of the first processor 110 and the first power supply 120 to the heat sink 130 may result in the first assembly 100 being a subassembly which can be attached to the circuit board 10 in a manner that will be described later herein.

The second assembly 200 (FIG. 1), if provided, may be substantially similar to the first assembly 100. Therefore, the second assembly 200 will not be described in detail. It is to be understood that the second assembly 200 may be substantially similar to the first assembly 100 in this exemplary embodiment.

Carrier Cage

With reference to FIG. 1, the present system may be provided with a carrier cage 220. As detailed in FIG. 4, the carrier cage 220 may be provided with a first wall 222, a second wall 232, a first side 252, a second side 282 and a third side 312.

The first wall 222 may be provided with a first surface 224, an oppositely disposed second surface 226, a first edge 228 and an oppositely disposed second edge 230. The second wall 232 may be provided with a first surface 234, an oppositely disposed second surface 236, a first edge 238 and an oppositely disposed second edge 240.

Figure 4:
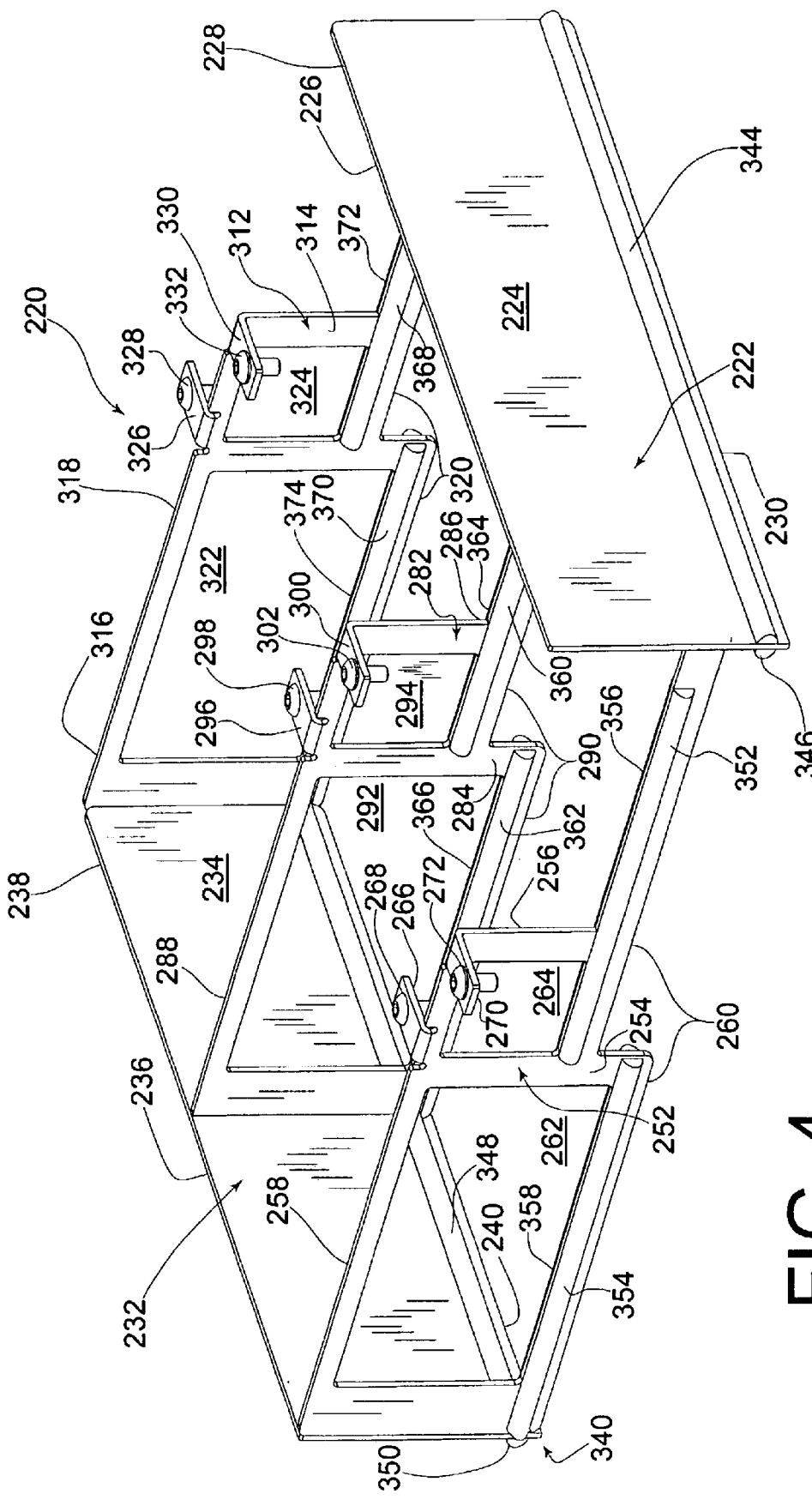
FIG. 4 shows a perspective view of an exemplary carrier cage illustrating a plurality of walls and sides that support a plurality of gaskets.

With continued reference to FIG. 4, the carrier cage first side 252 may be provided with a first surface 254, an oppositely disposed second surface 256, a first edge 258 and an oppositely disposed second edge 260. The first side 252 may be further provided with a first portal 262 and a second portal 264. The first and second portals 262, 264 may be formed in the first side 252 thereby providing fluid communication between the first surface 254 and the second surface 256.

The carrier cage first side 252 may also be provided with a first mounting tab 266 and a second mounting tab 270. The first mounting tab 266 may be provided with a hole 268. The first mounting tab 266 may be formed on the first side first edge 258 such that it extends from the second surface 256. The second mounting tab 270 may be provided with a hole 272. The second mounting tab 270 may be formed on the first side first edge 258 such that it extends from the first surface 254.

The carrier cage second side 282 may be provided with a first surface 284, an oppositely disposed second surface 286, a first edge 288 and an oppositely disposed second edge 290. The second side 282 may be further provided with a first portal 292 and a second portal 294. The first and second portals 292, 294 may be formed in the second side 282 thereby providing fluid communication between the first surface 284 and the second surface 286. The second side 282 may also be provided with a first mounting tab 296 and a second mounting tab 300. The first mounting tab 296 may be provided with a hole 298. The first mounting tab 296 may be formed on the second side first edge 288 such that it extends from the second surface 286. The second mounting tab 300 may be provided with a hole 302. The second mounting tab 300 may be formed on the second side first edge 288 such that it extends from the first surface 284.

With continued reference to FIG. 4, the carrier cage third side 312 may be provided with a first surface 314, an oppositely disposed second surface 316, a first edge 318 and an oppositely disposed second edge 320. The third side 312 may be further provided with a first portal 322 and a second portal 324. The first and second portals 322, 324 may be formed in the third side 312 thereby providing fluid communication between the first surface 314 and the second surface 316. The third side 312 may also be provided with a first mounting tab 326 and a second mounting tab 330. The first mounting tab 326 may be provided with a hole 328. The first mounting tab 326 may be formed on the third side first edge 318 such that it extends from the second surface 316. The second mounting tab 330 may be provided with a hole 332. The second mounting tab 330 may be formed on the third side first edge 318 such that it extends from the first surface 314.

As illustrated in FIG. 4, the carrier cage 220 may be configured such that the walls 222, 232 are attached to the sides 252, 282, 312. The carrier cage 220 may be configured with the sides 252, 282, 312 being parallel to each other and perpendicular to the walls 222, 232. This attachment of the components of the carrier cage 220 may occur by any type of attachment means such as, for example, welded, riveted, integral formed, soldered, threaded, adhered, etc. It should be noted that the carrier cage 220 may be composed of any of a variety of materials, such as plastic, ferrous metal, non-ferrous metal, etc. If the carrier cage 220 is made of a non-ferrous material, it may be made conductive, such as by spraying a metallic conductor thereon. In one exemplary embodiment, the carrier cage 220 may be an electrically conductive material such as cold rolled steel that is zinc plated.

Gaskets

With continued reference to FIG. 4, the carrier cage 220 may be provided with a plurality of EMI gaskets 340. The gaskets 340 may be any type of conventional EMI gasket material such as those described in U.S. Pat. No. 6,387,523 B2 of Bunyan et al. titled FLAME RETARDANT EMI SHIELDING GASKET issued on May 14, 2002; U.S. Pat. No. 6,451,374 of Watchko et al. titled MANUFACTURE OF LOW CLOSURE FORCE, FORM-IN-PLACE EMI SHIELDING GASKET issued on Sep. 17, 2002; and, U.S. Pat. No. 6,121,545 of Peng et al. titled LOW CLOSURE FORCE EMI SHIELDING SPACER GASKET issued on Sep. 19, 2000; or, other materials commercially available such as felt gasket, stamped tabs, etc. In one exemplary embodiment, the gaskets 340 may be braided metallic rope with an electrically conductive adhesive provided on one surface thereof. This electrical conductive adhesive may be capable of transferring current and signals between a gasket and the object to which it is attached.

The first wall 222 may be provided with a first gasket 344 and a second gasket 346. The first gasket 344 may be formed on the first wall first surface 224 near the second edge 230. The second gasket 346 may be formed on the first wall second surface 226 near the second edge 230.

As illustrated in FIG. 4, the second wall 232 may be provided with a third gasket 348 and a fourth gasket 350. The third gasket 348 may be formed on the second wall first surface 234 near the second edge 240. The fourth gasket 350 may be formed on the second wall second surface 236 near the second edge 240.

Figure 5:
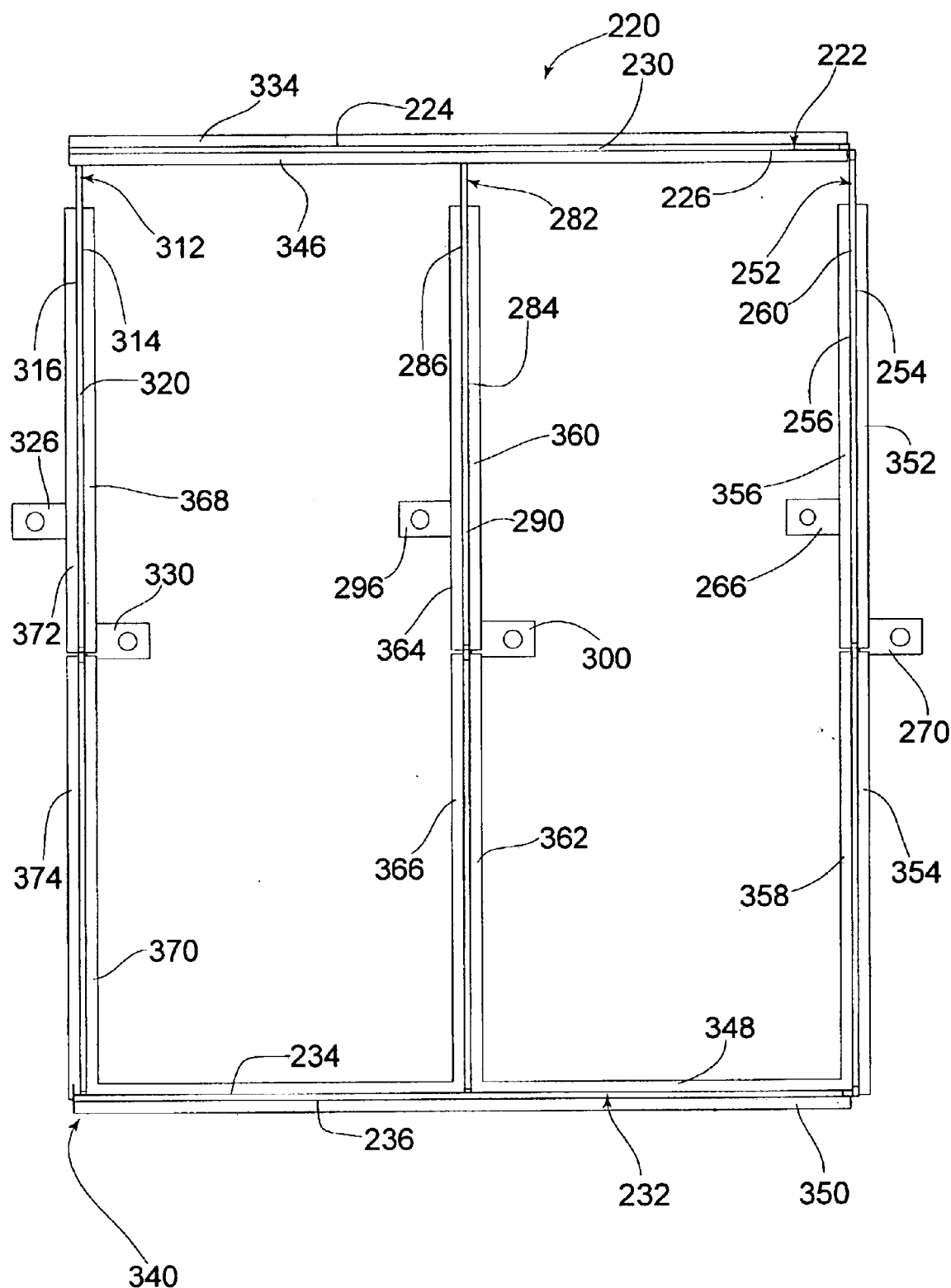
FIG. 5 shows a bottom plan view of the exemplary carrier cage of FIG. 4.

With reference to FIG. 5 showing a bottom plan view of the carrier cage 220 of FIG. 4, the first side 252 may be provided with a fifth gasket 352, a sixth gasket 354, a seventh gasket 356 and an eighth gasket 358. The fifth gasket 352 may be formed on the first side first surface 254 near the second edge 260 and, also, somewhat near the second portal 264 (FIG. 4) and the first wall 222. The sixth gasket 354 may be formed on the first side first surface 254 near the second edge 260, somewhat near the first portal 262 (FIG. 4) and the second wall 232. The seventh gasket 356 may be formed on the first side second surface 256 near the second edge 260, somewhat near the second portal 264 (FIG. 4) and the first wall 222. The eighth gasket 358 may be formed on the first side second surface 256 near the second edge 260 and, also, somewhat near the first portal 262 (FIG. 4) and the second wall 232.

With continued reference to FIG. 5, the second side 282 may be provided with a ninth gasket 360, a tenth gasket 362, an eleventh gasket 364 and a twelfth gasket 366. The ninth gasket 360 may be formed on the second side first surface 284 near the second edge 290, somewhat near the second portal 294 (FIG. 4) and the first wall 222. The tenth gasket 362 may be formed on the second side first surface 284 near the second edge 290, somewhat near the first portal 292 (FIG. 4) and the second wall 232. The eleventh gasket 364 may be formed on the second side second surface 286 near the second edge 290, somewhat near the second portal 294 (FIG. 4) and the first wall 222. The twelfth gasket 366 may be formed on the second side second surface 286 near the second edge 290, somewhat near the first portal 292 (FIG. 4) and the second wall 232.

The third side 312 may be provided with a thirteenth gasket 368, a fourteenth gasket 370, a fifteenth gasket 372 and a sixteenth gasket 374. The thirteenth gasket 368 may be formed on the third side first surface 314 near the second edge 320, somewhat near the second portal 324 (FIG. 4) and the first wall 222. The fourteenth gasket 370 may be formed on the third side first surface 314 near the second edge 320, somewhat near the first portal 322 (FIG. 4) and the second wall 232. The fifteenth gasket 372 may be formed on the third side second surface 316 near the second edge 320 and, also, somewhat near the second portal 324 (FIG. 4) and the first wall 222. The sixteenth gasket 374 may be formed on the third side second surface 316 near the second edge 320, somewhat near the first portal 322 (FIG. 4) near the second wall 232.

Overall Assembly

Having provided a detailed description of exemplary components of one embodiment of the present EMI containment device, the assembly thereof will now be provided. In general terms, the process of assembling the device may commence by constructing the first assembly 100, which includes mounting at least one electronic component (e.g. the first processor 110) to the heat sink 130. After constructing the first assembly 100, the first assembly 100 (and all other parts of the assembly, such as the first processor 110)

may be connected to the circuit board 10. It should be noted that the second assembly 200 may be assembled and attached in a similar manner as described for the first assembly 100. After connecting the assembly 100 to the circuit board 10 (and the second assembly 200, if first provided), the carrier cage 220 may be positioned to contain EMI generated by the electronic component. The detailed description of this assembly process will be presented later herein.

Figure 6:
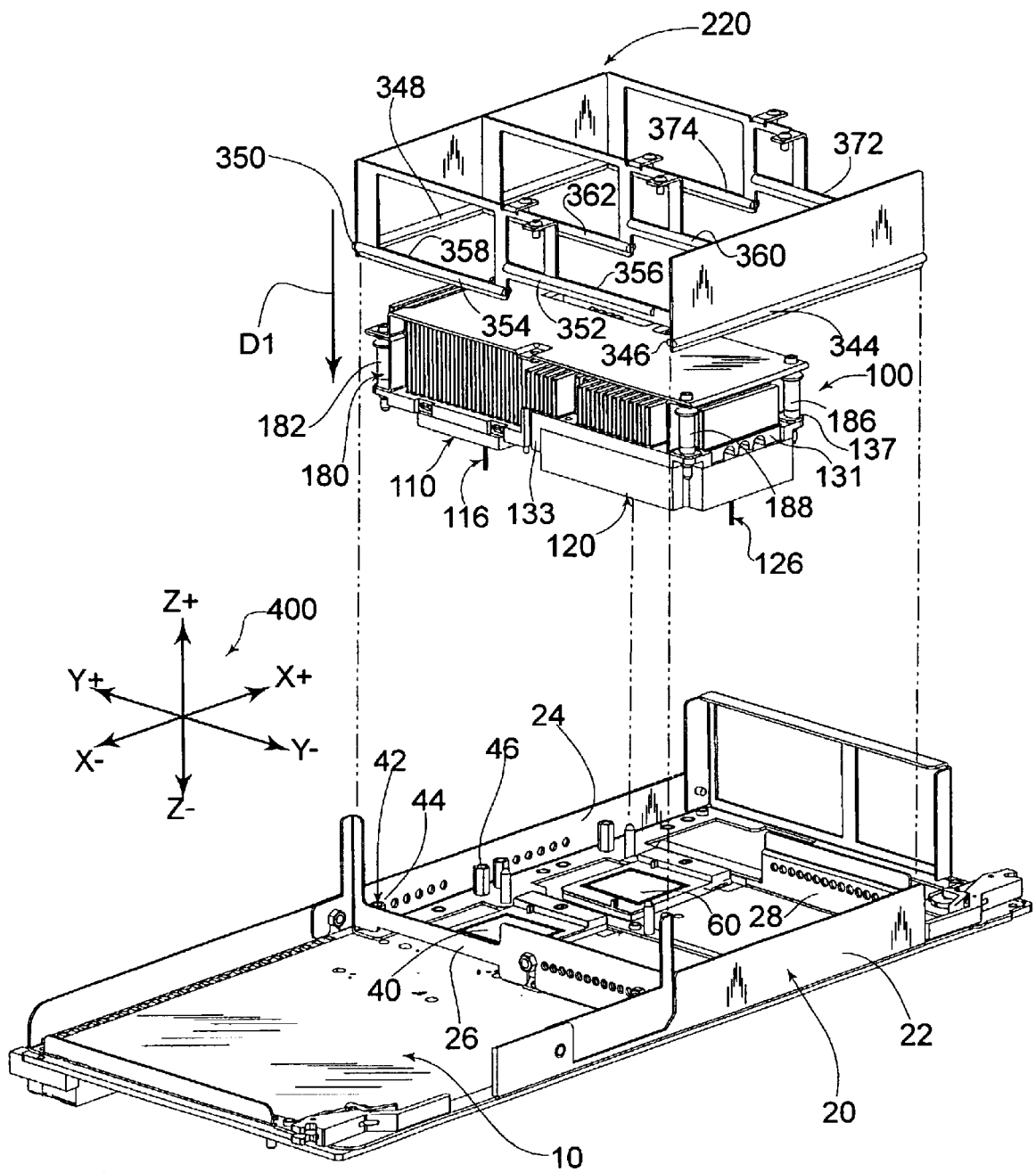
FIG. 6 shows a perspective view of an exemplary EMI containment device in an exploded state, the exploded state illustrates assembly steps for the EMI containment device.

For descriptive purposes only, an EMI icon 400 illustrated in FIG. 6 has been utilized for describing directions that electromagnetic interference (EMI) may travel from its source (e.g. the first processor 110). With reference to FIG. 6, the EMI icon 400 may be provided with a first direction denoted by 'X+' and an oppositely disposed second direction denoted by 'X−'. The EMI icon 400 may be further provided with a third direction denoted by 'Y+' and an oppositely disposed fourth direction denoted by 'Y−' (the third and fourth directions Y+, Y− may be perpendicular to and coplanar with first and second directions X+, X−). The EMI icon 400 may be further provided with a fifth direction denoted by 'Z+' and an oppositely disposed sixth direction denoted by 'Z−' (the fifth and sixth directions Z+, Z− may be perpendicular to first and second directions X+, X− and also perpendicular to the third and fourth directions Y+, Y−). It should be noted that the EMI icon 400 represents only a few directions in which EMI may travel.

Constructing the Assembly

The first step in assembling one exemplary embodiment of the present EMI containment device may be to construct the first assembly 100.

With reference to FIG. 3, this construction may include mounting electronic components to the first assembly heat sink 130. One such electronic component may be the first processor 110. When mounting the first processor 110 to the heat sink 130, the first processor first surface 112 may contact the heat sink second surface 134. This contact results in thermal communication between the first processor 110 and the heat sink 130. This mounting may include any of a variety of mounting devices, such as a bracket (not shown). Another electronic component that may be mounted to the first assembly heat sink 130 may be the first power supply 120. When mounting the first power supply 120 to the heat sink 130, the first power supply first surface 122 may contact the heat sink second surface 134. This contact results in thermal communication between the first power supply 120 and the heat sink 130. This mounting may include any of a variety of mounting devices, such as a bracket (not shown).

Having attached various electronic components (e.g. the first processor 110 and the first power supply 120) and the retention plate 162 to the heat sink 130, the first assembly 100 exists.

It should be noted that the second assembly 200 may be assembled in a similar manner as the first assembly 100.

Connecting the Assembly to the Circuit Board

The next step in assembling the EMI containment device may be to attach the first assembly 100 to the circuit board 10. With reference to FIG. 6, the first assembly 100 may be attached to the circuit board 10 in a two-step process: 1) forming an electrical connection and 2) forming a mechanical connection.

With continued reference to FIG. 6, when electrically connecting the first assembly 100 to the circuit board 10, the first processor contacts 116 may be connected to the circuit board first socket 40. It should be noted that this connection often requires 'steady hands' because the first processor contacts 116 may be relatively fragile and, therefore, the connection to the first socket 40 may be somewhat difficult. The first power supply 120 may be simultaneously connected to the circuit board 10 by interfacing the power supply contacts 126 with receptacles (not shown) formed in the circuit board 10. This electrical connection may result in the first processor 110 and the first power supply 120 being electrically connected to the circuit board 10.

After electrically connecting the first assembly 100 to the circuit board 10, the mechanical connection may take place.

The mechanical connection may occur by engaging the clamps 180 with the circuit board first assembly mounts 42. This engagement may occur, for example, by threading each of the clamps 180 into one of the corresponding first assembly mounts 42. For example, the first clamp 182 may be threaded into the first heat sink mount 44; the second clamp 184 (FIG. 3) may be threaded into the second heat sink mount 46; the third clamp 186 may be threaded into the third heat sink mount 48 (FIG. 2); and, the fourth clamp 186 may be threaded into the fourth heat sink mount 50 (FIG. 2).

The next step in assembling the EMI containment device may be to attach the second assembly 200 to the circuit board 10. Since the second assembly 200 may be substantially similar to the first assembly 100, the description of attachment of the second assembly 200 to the circuit board 10 will not be detailed herein.

Positioning the EMI Cage

After connecting (electrically and mechanically) the first assembly 100 to the circuit board 10, the carrier cage 220 may be positioned. The positioning may occur by moving the carrier cage 220 in an installation direction denoted by 'D1' in FIG. 6. With continued reference to FIG. 6, this movement in the installation direction D1 may result in first wall first gasket 344 contacting the frame first wall 22; this movement may also place the second gasket 346 in contact with the first assembly heat sink first side 131. Movement of the carrier cage 220 in the installation direction D1 may also place the fifth gasket 352 and the sixth gasket 354 in contact with the frame third wall 26. Additionally, this movement may also place the seventh gasket 356 and the eighth gasket 358 in contact with the first assembly heat sink second side 133. This movement may also place the third gasket 348 into contact with the first assembly heat sink third side 135 (FIG. 3). Additionally, the fourth gasket 350 may make contact with the frame second wall 24. The ninth gasket 360 and the tenth gasket 362 may contact the first assembly heat sink fourth side 137 as a result of this carrier cage 220 movement in the installation direction D1.

With continued reference to FIG. 6, in a similar manner, the second assembly 200 (FIG. 1) may contact the carrier cage gaskets 340 when the carrier cage 220 moves in the installation direction D1. The eleventh gasket 364 (FIG. 4), twelfth gasket 366 (FIG. 4), thirteenth gasket 368 (FIG. 4), fourteenth gasket 370 (FIG. 4) may contact the second assembly 200 (FIG. 1) in a manner substantially similar to that previously described with respect to the first assembly 100.

This movement of the carrier cage 220 in the installation direction D1 may also result in the fifteenth gasket 372 and the sixteenth gasket 374 being placed into contact with the frame fourth wall 28.

After positioning the carrier cage 220 such that the gaskets 340 electrically interface the first assembly 100 to the frame 20, the carrier cage 220 may be secured to the circuit board 10. One method of securing the carrier cage 220 to the circuit board 10 is to attach it to the first assembly 100. With reference to FIG. 1, the carrier cage 220 may be attached to the first assembly 100 and the second assembly 200 by a plurality of screws 380 The plurality of screws 380 may include a first screw 382, a second screw 384, a third screw 386 and a fourth screw 388. The carrier cage 220 may be attached to the first assembly 100 by the first screw 382 and the second screw 384. The first screw 382 may be positioned in the carrier cage first side first mounting tab hole 268 (FIG. 4) and threaded into the first assembly retention device retention plate second mount 194 (FIG. 3). The second screw 384 may be positioned in the carrier cage second side second mounting tab hole 302 (FIG. 4) and threaded into the first assembly retention device retention plate first mount 192 (FIG. 3). In a similar manner, the third and fourth screws 386, 388 may be positioned in the carrier cage side mounting tab holes 298, 332 (FIG. 4) and threadingly engaged with the second assembly 200.

Resulting EMI Containment

Figure 7:
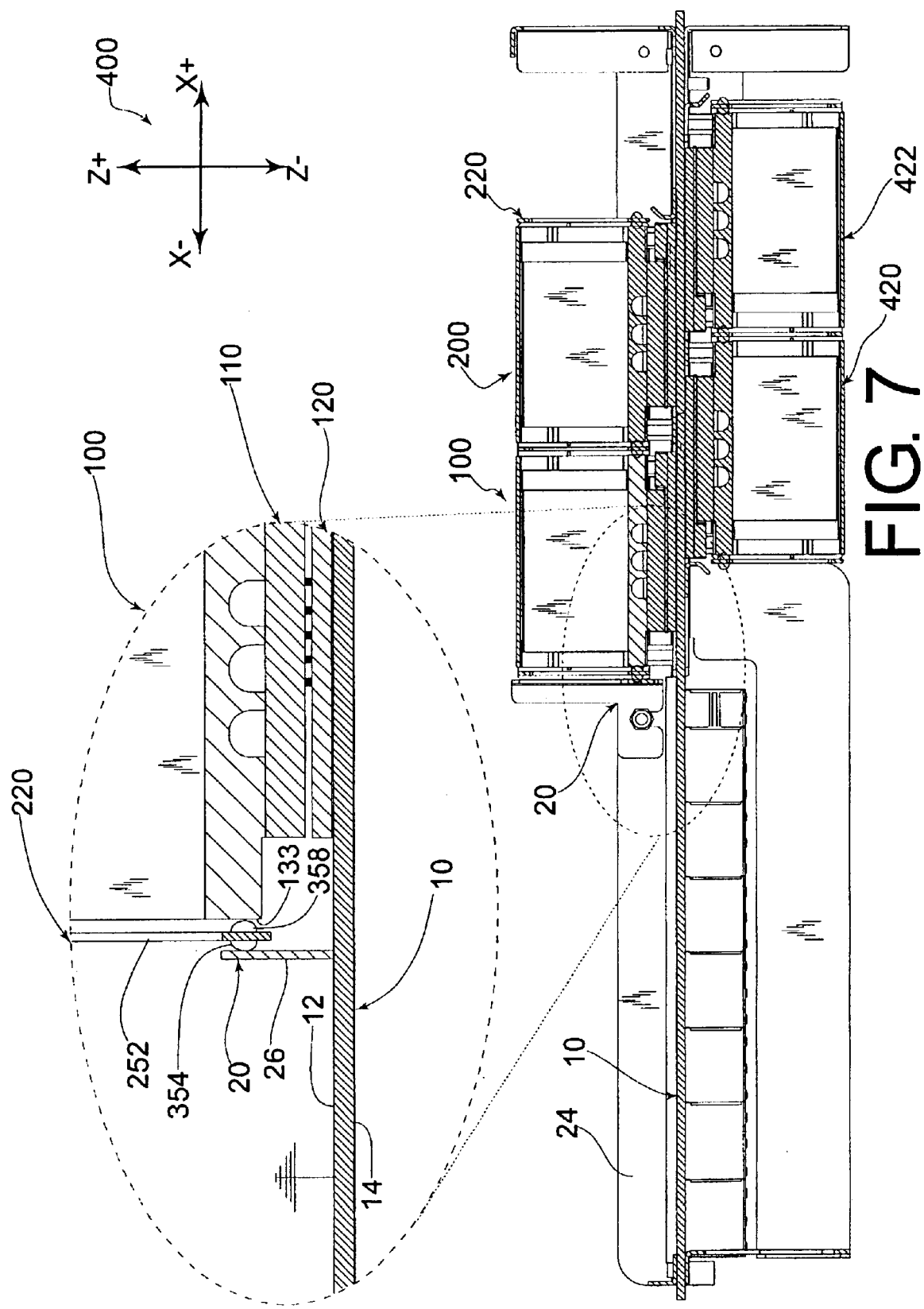
FIG. 7 shows a cross-sectional view taken across plane 7—7 in FIG. 1 of the exemplary EMI containment device illustrated in FIG. 1.

FIG. 7 illustrates a representative cross-sectional view taken across plane 7—7 in FIG. 1. As illustrated, the EMI containment area 410 is bound by various components of the present EMI containment device. These various components may be referred to as a 'faraday cage' that absorbs EMI and transfers this absorbed EMI to ground.

With continued reference to FIG. 7, this positioning of the carrier cage 220 results in an EMI containment area 410 that substantially reduces EMI from emitting to surrounding components. As used herein, the term 'containment area' may refer to an area that substantially blocks EMI from being emitted therefrom. Gaskets allow for currents to flow between the first assembly and the circuit board via the carrier cage and the circuit board frame.

As previously described, electromagnetic interference (EMI) may travel from its source (e.g. the first processor 110 and/or the first power supply 120) in all directions. The present device contains this EMI in the EMI containment area 410 defined by the first assembly 100, the second assembly 200, the circuit board 10 and the frame 20. For example, the circuit board frame fourth wall 28 may absorb EMI (sometimes referred to herein as signals) that is traveling in the first direction X+ and transmit it to ground. Additionally, the circuit board frame third wall 26 may absorb EMI that is traveling in the second direction X−. With reference to FIG. 6, in a similar manner, the circuit board frame second wall 24 may absorb EMI that is traveling in the third direction Y+. And, the circuit board frame first wall 22 may contain EMI that is traveling in the fourth direction Y−. EMI that is traveling in the sixth direction Z− from its source may be absorbed by the circuit board first surface 12.

With reference to FIG. 7, EMI that is emitted in the fifth direction Z+ may be absorbed by components located in the path of the EMI. For example, EMI emitted by the first processor 110 that is traveling in the fifth direction Z+ may be absorbed by the first assembly heat sink 130. This absorbed EMI may be transferred to ground via the carrier cage 220, the frame 20 and the circuit board 10. One exemplary path for transferring EMI to ground may be from the first assembly heat sink 130 to the carrier cage 220 via the first side eighth gasket 358. This EMI may be transferred from the carrier cage 220 to the frame third wall 26 via the first side sixth gasket 354. Additionally, the absorbed EMI may be transferred from the frame third wall 26 to the circuit board first surface 12. Since the circuit board first surface 12 may be grounded, the EMI may be completely absorbed.

Alternative Embodiments

In one exemplary embodiment, the present EMI containment device may be implemented with devices having more than one assembly (e.g. as described, one exemplary EMI containment device may have the first assembly 100 and the second assembly 200). As illustrated in FIG. 7, the EMI containment device may be provided with the first assembly 100, the second assembly 200, a third assembly 420 and a fourth assembly 422. The third and fourth assemblies may be attached to the circuit board second side 14.

In another exemplary embodiment, the carrier cage 220 may be attached to the clamp assembly 166 as described, or, alternatively, to other components of the present EMI containment device. For example, the carrier cage 220 may be attached to the frame 20, to the circuit board 10, or to other component not specifically described herein (but commonly found in this type of device).

While illustrative embodiments have been described in detail herein, it is to be understood that the concepts may be otherwise variously embodied and employed and that the appended claims are intended to be construed to include such variations except insofar as limited by the prior art.

We claim:

1. A method of containing electromagnetic interference comprising:
   providing a circuit board comprising:
      a first surface;
      a frame protruding from said circuit board first surface; and
      a socket formed on said first surface;
   providing an assembly comprising an electronic component that generates said electromagnetic interference;
   connecting said electronic component to said socket;
   providing a cage comprising at least one gasket; and
   positioning said cage adjoining said frame of said circuit board with said assembly connected thereto.

2. The method of claim 1
   wherein said positioning said cage adjoining said circuit board comprises compressing said gasket between said frame and said assembly.

3. The method of claim 1 and further comprising:
   said providing said assembly comprises providing said assembly comprising a heat sink, said heat sink being in thermal communication with said electronic component; and
   attaching said cage to said heat sink.

4. The method of claim 1 and further comprising:
   attaching said cage to said assembly after said connecting said electronic component to said socket.

5. The method of claim 1 wherein said providing said cage comprises providing said cage with at least one portal; and
   dispensing heat generated by said electronic component through said cage portal.

6. The method of claim 1 and further comprising:
   providing said circuit board comprises providing a second socket, said second socket being formed on said first surface;
   providing a second assembly comprising a second electronic component that also generates said electromagnetic interference;
   connecting said second electronic component to said second socket; and
   wherein said positioning said cage also comprises positioning said cage adjoining said circuit board with second assembly connected thereto.

7. The method of claim 1 wherein said providing said circuit board comprises providing said circuit board comprising a frame that is grounded.

8. The method of claim 1 wherein said providing said circuit board comprises providing said circuit board comprising a frame creating an EMI containment area.

9. An electromagnetic interference containment device comprising:

a circuit board;

a socket formed on said circuit board;

an assembly electrically interfaced with said socket;

a cage adjoining said circuit board and said assembly;

a gasket formed on said cage;

a frame formed on and protruding from said circuit board; and wherein said gasket adjoins said frame and said assembly.

10. The device of claim 9 wherein said cage is removably attached to said assembly.

11. The device of claim 9 wherein said assembly comprises a heat sink; and wherein said heat sink is adjacent to said cage.

12. The device of claim 9 wherein said frame comprises a plurality of walls.

13. The device of claim 9 wherein said frame is electrically interfaced with said circuit board.

14. A method of constructing an electromagnetic interference containment area comprising:

providing a circuit board, said circuit board defining a first containment plane;

providing an assembly, said assembly defining a second containment plane;

positioning said assembly adjacent to said circuit board with said second containment plane parallel to said first containment plane;

providing a cage, said cage comprising a grounding path;

after said positioning said assembly, positioning said cage adjacent to said assembly and said circuit board with said cage grounding path electrically interfacing said first containment plane and said second containment plane; and wherein, said electromagnetic interference containment area is bound by said first containment plane, said second containment plane and said cage grounding path.

\* \* \* \* \*